United States Patent
Jones et al.

(10) Patent No.: US 6,788,084 B2
(45) Date of Patent: *Sep. 7, 2004

(54) TEMPERATURE CONTROL OF ELECTRONIC DEVICES USING POWER FOLLOWING FEEDBACK

(75) Inventors: Thomas P. Jones, Westerville, OH (US); Jonathan E. Turner, Westerville, OH (US); Mark F. Malinoski, Westerville, OH (US)

(73) Assignee: Delta Design, Inc., Poway, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/234,516

(22) Filed: Sep. 5, 2002

(65) Prior Publication Data

US 2003/0001605 A1 Jan. 2, 2003

Related U.S. Application Data

(63) Continuation of application No. 09/352,760, filed on Jul. 14, 1999, now Pat. No. 6,489,793, which is a continuation of application No. 08/734,212, filed on Oct. 21, 1996, now Pat. No. 6,476,627.
(60) Provisional application No. 60/092,720, filed on Jul. 14, 1998.

(51) Int. Cl.[7] .......................... G01R 31/02; G01R 31/26
(52) U.S. Cl. ........................................ 324/760; 324/765
(58) Field of Search ................... 324/760, 763–765, 324/158.1; 219/209; 702/130, 300, 310, 320–324, 330, 340; 713/300, 310, 320–324, 330, 340

(56) References Cited

U.S. PATENT DOCUMENTS

| | | |
|---|---|---|
| 3,710,251 A | 1/1973 | Hagge et al. |
| 3,922,527 A | 11/1975 | Witkin et al. |
| 3,971,876 A | 7/1976 | Witkin et al. |
| 4,066,868 A | 1/1978 | Witkin et al. |
| 4,324,285 A | 4/1982 | Henderson |
| 4,330,809 A | 5/1982 | Stanley |
| 4,604,572 A | 8/1986 | Horiuchi et al. |
| 4,635,256 A | 1/1987 | Herlein |
| 4,635,259 A | 1/1987 | Schinabeck et al. |
| 4,637,020 A | 1/1987 | Schinabeck |

(List continued on next page.)

FOREIGN PATENT DOCUMENTS

| | | |
|---|---|---|
| DE | 35 36098 | 4/1987 |
| WO | 94/22029 | 9/1994 |
| WO | 98/05060 | 2/1998 |

OTHER PUBLICATIONS

"Patent Abstracts of Japan", *Electric Apparatus Cooling Circuit*, Application No. 08072841, (Mar. 27, 1996); Abstract of Warisaya Kanji, 09264647, (Oct. 7, 1997).

English Abstract of Japanese Patent Document No. 09264647, published Oct. 7, 1997.

Tustaniwskyj, Jerry I., et al. *Constant Temperature Control of a Device Under Test (DUT)–Part 1*, Development Services ORganization, Unisys Corporation, San Diego, CA, pp. 1–6.

*Primary Examiner*—David A. Zarnecke
*Assistant Examiner*—Jermele Hollington
(74) *Attorney, Agent, or Firm*—Foley & Lardner LLP

(57) ABSTRACT

A system and method for controlling a temperature of a device during testing with a thermal controller and a heat exchanger includes measuring an instantaneous power consumption of the device during testing. The heat exchanger is controlled with the thermal controller using the measured instantaneous power consumption by the device to regulate the temperature of the device during testing, wherein the heat exchanger is in conductive contact with the device.

30 Claims, 13 Drawing Sheets

U.S. PATENT DOCUMENTS

| | | |
|---|---|---|
| 4,646,299 A | 2/1987 | Schinabeck et al. |
| 4,651,038 A | 3/1987 | Cline et al. |
| 4,675,562 A | 6/1987 | Herlein et al. |
| 4,686,627 A | 8/1987 | Donovan et al. |
| 4,713,612 A | 12/1987 | Takamine |
| 4,734,872 A * | 3/1988 | Eager et al. .................. 374/135 |
| 4,744,408 A | 5/1988 | Pearson et al. |
| 4,777,434 A | 10/1988 | Miller et al. |
| 4,784,213 A | 11/1988 | Eager et al. |
| 4,789,835 A | 12/1988 | Herlein |
| 4,820,944 A | 4/1989 | Herlein et al. |
| 4,849,702 A | 7/1989 | West et al. |
| 4,881,591 A | 11/1989 | Rignall |
| 4,926,118 A | 5/1990 | O'Connor et al. |
| 5,006,796 A | 4/1991 | Burton et al. |
| 5,084,671 A | 1/1992 | Miyata et al. |
| 5,099,908 A | 3/1992 | Taraci et al. |
| 5,126,656 A | 6/1992 | Jones |
| 5,143,450 A | 9/1992 | Smith et al. |
| 5,164,661 A * | 11/1992 | Jones .......................... 324/760 |
| 5,172,049 A | 12/1992 | Kiyokawa et al. |
| 5,177,435 A | 1/1993 | Kiyokawa et al. |
| 5,198,752 A | 3/1993 | Miyata et al. |
| 5,205,132 A * | 4/1993 | Fu .............................. 62/208 |
| 5,233,161 A | 8/1993 | Farwell et al. |
| 5,263,775 A | 11/1993 | Smith et al. |
| 5,287,292 A | 2/1994 | Kenny et al. |
| 5,297,621 A | 3/1994 | Taraci et al. |
| 5,309,090 A | 5/1994 | Lipp |
| 5,315,236 A * | 5/1994 | Lee ............................ 324/157 |
| 5,315,240 A * | 5/1994 | Jones .......................... 324/760 |
| 5,322,161 A * | 6/1994 | Shichman et al. ............. 62/208 |
| 5,324,916 A | 6/1994 | Goto et al. |
| 5,332,884 A | 7/1994 | Bailey |
| 5,359,285 A | 10/1994 | Hashinaga et al. |
| 5,369,245 A | 11/1994 | Pickering |
| 5,381,087 A | 1/1995 | Hirano |
| 5,420,521 A * | 5/1995 | Jones .......................... 324/760 |
| 5,452,401 A * | 9/1995 | Lin .............................. 713/322 |
| 5,457,400 A | 10/1995 | Ahmad et al. |
| 5,485,179 A | 1/1996 | Otsuka et al. |
| 5,552,744 A | 9/1996 | Burlison et al. |
| 5,557,551 A * | 9/1996 | Craft .......................... 702/130 |
| 5,569,950 A | 10/1996 | Lewis et al. |
| 5,582,235 A | 12/1996 | Hamilton et al. |
| 5,614,837 A | 3/1997 | Itoyama et al. |
| 5,648,728 A | 7/1997 | Canella |
| 5,664,202 A * | 9/1997 | Chen et al. ................. 713/340 |
| 5,802,856 A | 9/1998 | Schaper et al. |
| 5,821,505 A | 10/1998 | Tustaniwskyj et al. |
| 5,844,208 A | 12/1998 | Tustaniwskyj et al. |
| 5,847,293 A | 12/1998 | Jones |
| 5,864,176 A | 1/1999 | Babock et al. |
| 5,894,217 A | 4/1999 | Igarashi et al. |
| 5,928,365 A * | 7/1999 | Yoshida ....................... 713/324 |
| 6,104,003 A * | 8/2000 | Jones .......................... 219/209 |
| 6,288,371 B1 * | 9/2001 | Hamilton et al. ........... 324/760 |
| 6,304,093 B1 * | 10/2001 | Hilmoe et al. .............. 324/760 |
| 6,389,225 B1 * | 5/2002 | Malinoski et al. .......... 219/494 |
| 6,468,023 B1 * | 10/2002 | Hilmoe ....................... 414/763 |
| 6,476,627 B1 * | 11/2002 | Pelissier et al. ............. 324/760 |
| 6,489,793 B2 * | 12/2002 | Jones et al. ................. 324/760 |
| 6,498,899 B2 * | 12/2002 | Malinoski et al. .......... 392/479 |
| 6,518,782 B1 * | 2/2003 | Turner ....................... 324/760 |
| 6,549,026 B1 * | 4/2003 | DiBattista et al. .......... 324/760 |

* cited by examiner

Test Conditions:
- Target chip - thermal test device w/resistive heating die and embedded RTD, flip chip bonded to plastic substrate
- Die Size 1.06 sq.cm.
- theta d-h ~ 0.4 °C/W Forced Air System performance Flip Chip Power Balancing™

TEMPERATURE CONTROL OF ELECTRONIC DEVICES USING POWER FOLLOWING FEEDBACK

CROSS-REFERENCE TO RELATED APPLICATION

This application is a continuation of application Ser. No. 09/352,760, filed on Jul. 14, 1999 U.S. Pat. No. 6,489,793 which is a continuation of application Ser. No. 08/734,212 filed Oct. 21, 1996, now U.S. Pat. No. 6,476,627, and which claims the priority of previously filed provisional application number 60/092,720, filed on Jul. 14, 1998, which are hereby incorporated as if fully set forth herein.

BACKGROUND OF THE INVENTION

1. Field of the Invention

This invention relates in general to the field of temperature control and more particularly to an improved apparatus and method of providing temperature control to electronic devices using power following feedback.

2. Description of Related Art

The present invention relates to temperature control systems which maintain the temperature of an electronic device at or near a constant set point temperature while the device is being operated or tested. Two examples of electronic devices which are best operated at a constant or near constant temperature are packaged integrated chips and bare chips which are unpackaged. Maintaining the chip temperature near a constant set point is not difficult if the power dissipation of the chip is constant or varies in a small range while operating or testing. One way of handling such a situation is to couple the chip through a fixed thermal resistance to a thermal mass which is at a fixed temperature. But if the instantaneous power dissipation of the chip varies up and down in a wide range while operating or testing, then maintaining the chip temperature near a constant set point is very difficult.

Various temperature forcing systems are used to respond to the chip's temperature variation caused by widely varying power dissipation of the chip. Feedback methods are commonly used to sense the varying temperature. Typical approaches involve the use of a temperature sensing device such as a thermocouple, mounted on the chip package or chip itself. Another approach is to integrate a temperature sensing device, such as a thermal diode, into the chip circuitry. Such a temperature sensing device would be used to sense changes in the chip's temperature, and then adjust the temperature forcing system appropriately.

There are several problems with the use of temperature sensing devices. In the case of packaged chips, an externally mounted thermocouple will indicate the temperature of the package surface, not the temperature of the chip inside the package. At some level of power dissipation, this temperature difference will be significant to the test result. The use of temperature sensors integrated into the chip itself addresses this problem, but raises other issues. It is not typical practice for the chip manufacturer to integrate temperature sensors on the chip. Even if it were, each chip's temperature sensor would have unique calibration requirements. All of the above present problems for high volume chip manufacturing.

Temporary temperature sensors, such as thermocouple probes, included in automated test handling equipment can address some of these issues. However, the package temperature vs. die temperature problem will remain. Also, the reliability of the temporary temperature sensor introduces error which can be significant to the high volume chip manufacturing test result. Moreover, the surface available for temperature control is the same surface needed for the temporary temperature sensor, complicating the problem further.

Therefore, a need has arisen for an apparatus and method of temperature control for electronic devices which can respond to the temperature of the electronic device, instead of the package. A further need exists for an apparatus and method of temperature control for electronic devices which can conveniently be used for high volume chip manufacturing. A further need exists for an apparatus and method of temperature control for electronic devices which is reliable. A further need exists for an apparatus and method of temperature control for electronic device which does not require significant surface area of the electronic device. A further need exists for a method of temperature control for electronic devices which does not require temperature sensing devices to be integrated into the chip or to be temporarily in contact with the chip. A further need exists for a method of temperature control for electronic devices which does not require collecting, maintaining, and applying the use of chip power profiles, and does not require the capability of performing such tasks in the automated test equipment, temperature forcing system, and testing software.

The present invention is directed to overcoming or at least reducing the effects of one or more of the problems set out above.

SUMMARY OF THE INVENTION

Briefly, in accordance with one aspect of the present invention, a method for controlling a temperature of a device during testing with a thermal controller and a heat exchanger includes measuring an instantaneous power consumption of the device during testing, and controlling the heat exchanger with the thermal controller using the measured instantaneous power consumption by the device to regulate the temperature of the device during testing, wherein the heat exchanger is in conductive contact with the device.

In another aspect of the present invention, the device is an integrated circuit device.

In yet another aspect of the present invention, the heat exchanger is conductively coupled to the device, the heat exchanger being responsive to changes in the measured instantaneous power consumption by the device to regulate the temperature of the device.

In a further aspect of the present invention, the heat exchanger comprises a heat sink having a surface on which a heater element is incorporated, the heat sink removing heat from the device when the temperature of the device exceeds a temperature below a predetermined set-point temperature, and the heater element is controlled based on the measured instantaneous power consumption by the device to selectively introduce heat to maintain the device near the predetermined set-point.

In yet a further aspect of the present invention, measuring an instantaneous power consumption includes measuring the current provided to the device while the device is being tested.

DETAILED DESCRIPTION OF AN EMBODIMENTS

Figure 1A:
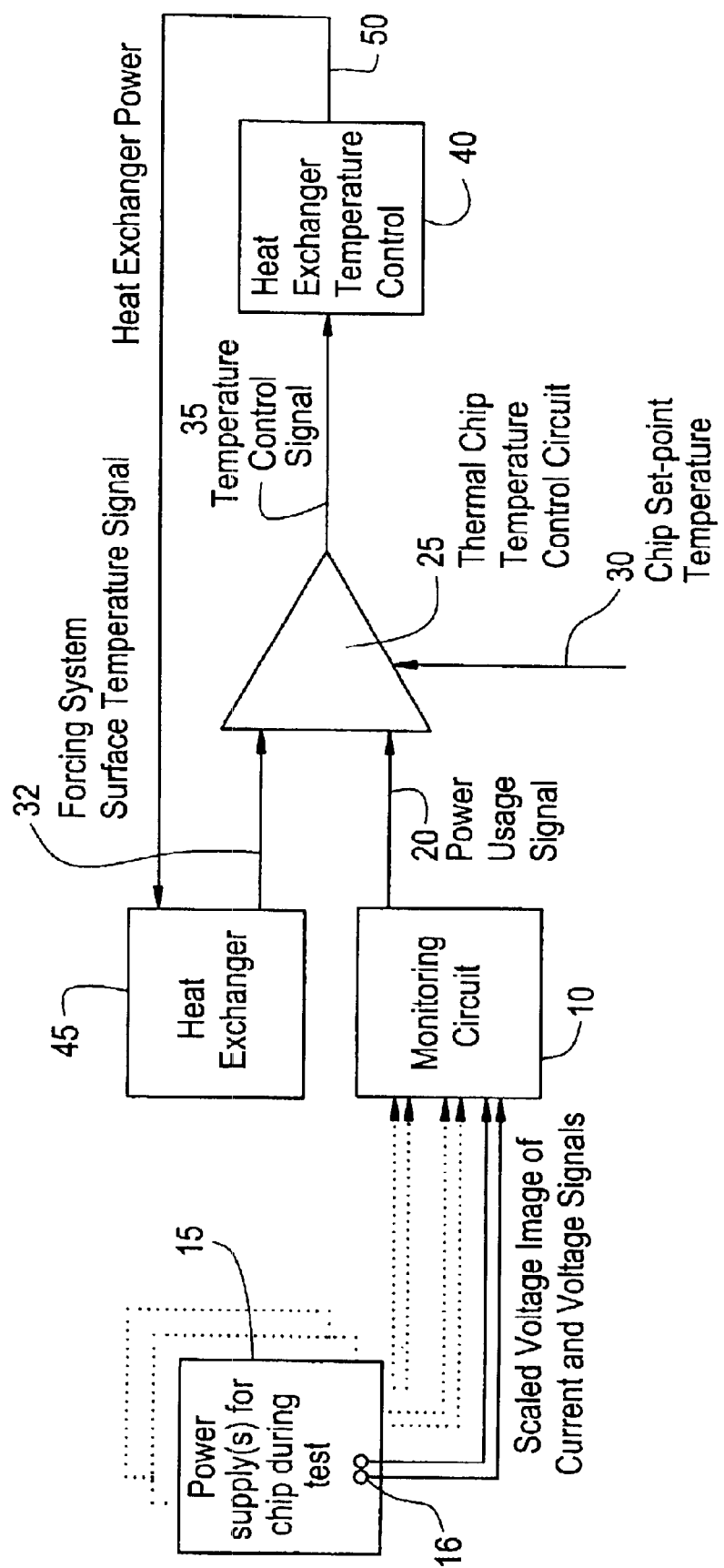
FIG. 1A is a block diagram illustrating an embodiment of the present invention.

The above-noted and other aspects of the present invention will become more apparent from a description of an embodiment, when read in conjunction with the accompanying drawings. The drawings illustrate an embodiment of the invention. In the drawings, the same members have the same reference numerals.

Pending patent application U.S. Ser. No. 08/734,212 to Pelissier, now U.S. Pat. No. 5,476,627, assigned to the present assignee, is hereby incorporated as fully set forth herein. Co-pending provisional patent application U.S. Ser. No. 60/092,715 to Jones et al. also assigned to the present assignee, filed on Jul. 14, 1998, is also hereby incorporated as if fully set forth herein.

1. Central Principles

When a device is tested, the tests need to be run at a specified temperature, known as a set point. The device, which is also called the device under test ("DUT"), is typically tested at several different set points and the performance at each set point is noted. The performance of the DUT is often measured as the maximum operating frequency, $f_{max}$, at a given set point. A DUT is typically faster (high $f_{max}$) at lower temperatures and slower (low $f_{max}$) at higher temperatures. A higher $f_{max}$ indicates a better performing DUT and, therefore, a more valuable DUT.

It has become increasingly difficult to maintain a given set point. One of the reasons is the DUT self-heating which occurs during a test. The DUT self-heats because it draws power during the test. If the DUT cannot be maintained at the set point during a test sequence, and it heats up, then, as indicated above, the performance of the DUT will go down. This results in underreporting the DUT's performance because if the temperature had been kept at the desired, lower temperature, then the performance would have been better. The same device could then have been sold at a higher price. The price is typically exponentially higher for a faster device. Thus, the impact is large for manufacturers who must, understandably, accept the underreported performance.

Figure 8:
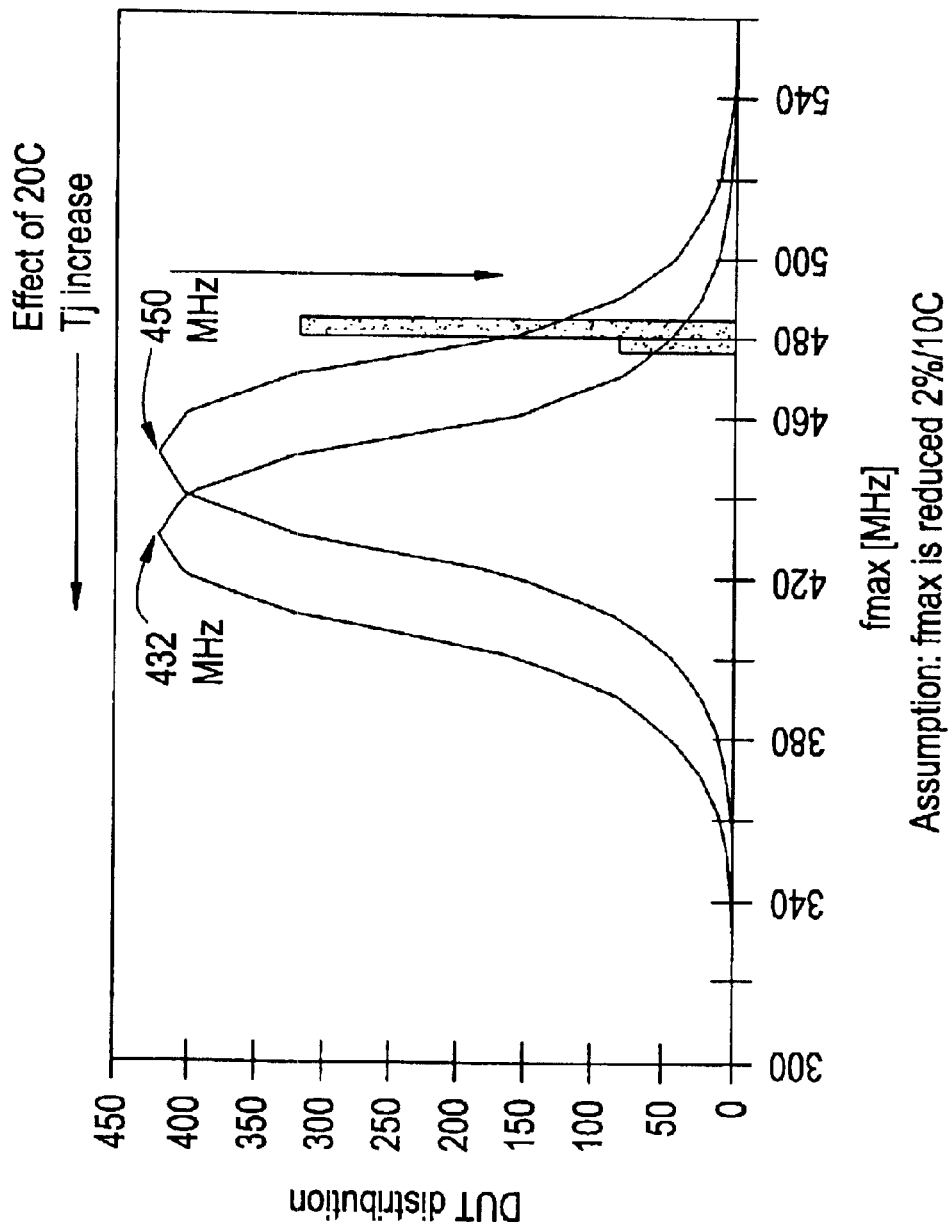
FIG. 8 contains a graph illustrating the effect of controlling self-heating versus not controlling self-heating on the performance distribution of a device lot.

The number of devices affected is also exponentially related to the temperature increase from self-heating. As FIG. 8 indicates, the distribution of the performance of a given lot of devices typically has a normal distribution about some center frequency. That center frequency is approximately 450 MHz in FIG. 8, for the right-most curve. In this example, the high performing devices are considered to be those with an $f_{max}$ of 480 MHz or greater.

If the set point can be maintained, then all of the devices of the right-most curve which are in the tail to the right of 480 MHz will be high performing devices. However, if the set point cannot be maintained due to self-heating, then the curve will shift, resulting in the left-most curve, for example. In this example, the actual junction temperature of the device is assumed to increase by 20 degrees C., which would result in approximately a 4% decrease in performance. The distribution of devices in this lot is therefore shifted to the left, so that it is centered around approximately 432 MHz (4% of 450=18). This shifted curve is represented by the left-most curve. However, a high performing device still needs to have an $f_{max}$ of 480 MHz or greater. The high performance area of the curve has thus moved further into the tail of the distribution. As is clear from the area under the curve, the number of high performance devices is now exponentially smaller.

This problem would continue to get worse. Industry trends are toward devices which operate at greater frequencies and occupy less area. This causes the devices to use more power, have greater power spikes or transitions, and to be less able to dissipate the heat which they generate.

Many semiconductors utilize complementary metal oxide semiconductor ("CMOS") technology. One of the characteristics of CMOS is that it draws a large spike in power when it switches states. Further, as a CMOS device is operated at a faster speed, the device will typically switch more quickly and more often. This will require more power and will also result in large, fast changes in instantaneous power consumption. Thus, more heat will be generated.

This situation is aggravated by the decreasing size and thermal mass of the devices. This results in less "space" into which the heat of the device can dissipate or diffuse. The net result will be larger variations in DUT temperature due to self-heating and increased underreporting of DUT performance.

Figure 5:
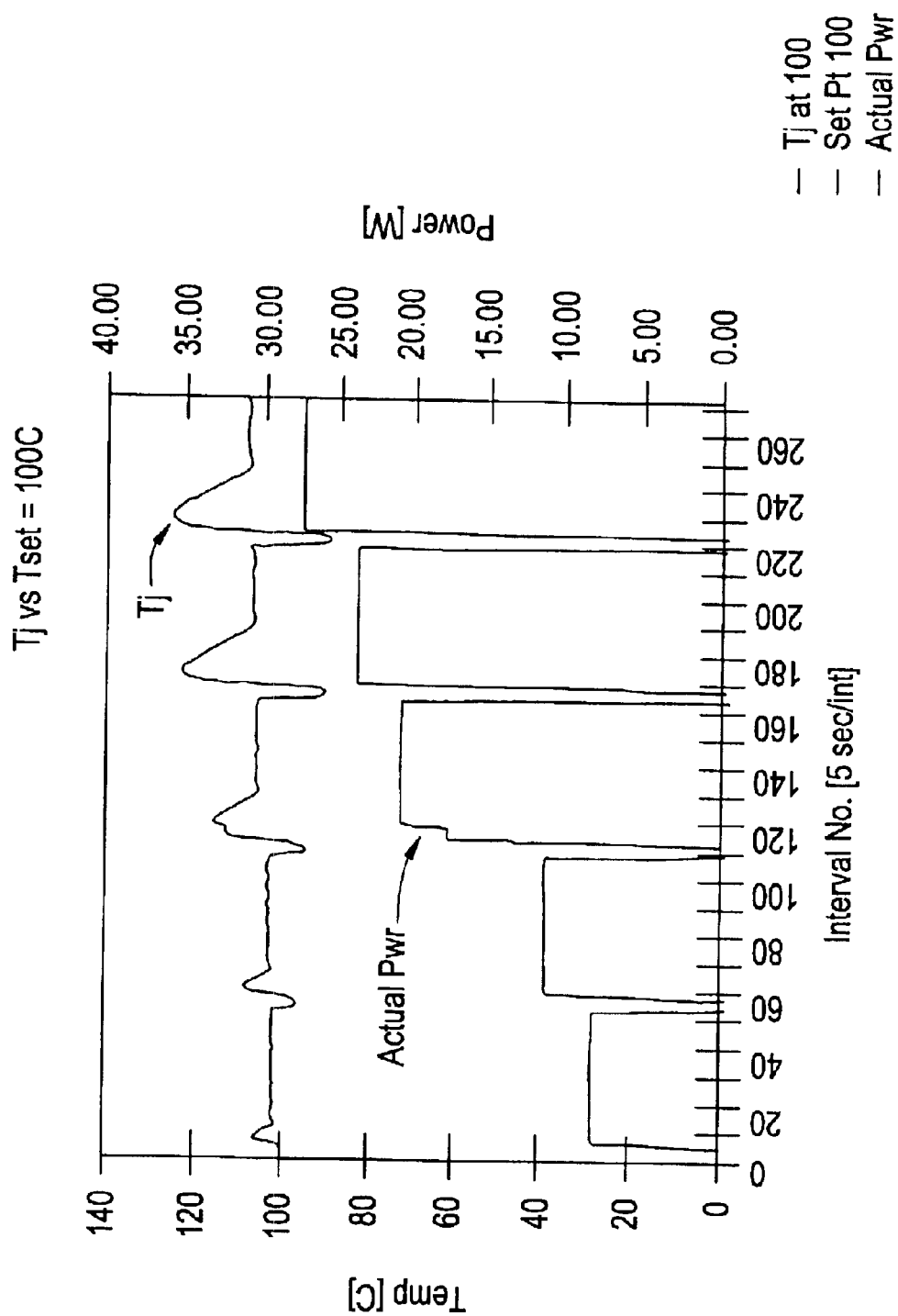
FIG. 5 contains a graph illustrating the performance of a forced air system.

Convection systems have proven ineffective, as have improvements to them. Referring to FIG. 5, there is shown the performance of a forced air system when analyzed in terms of junction temperature in a device and power drawn by the device. The deviation in the junction temperature from the desired set point increases as the power drawn by the device increases. As can be seen, the deviation exceeds twenty degrees C. at several transition points.

Figure 6:
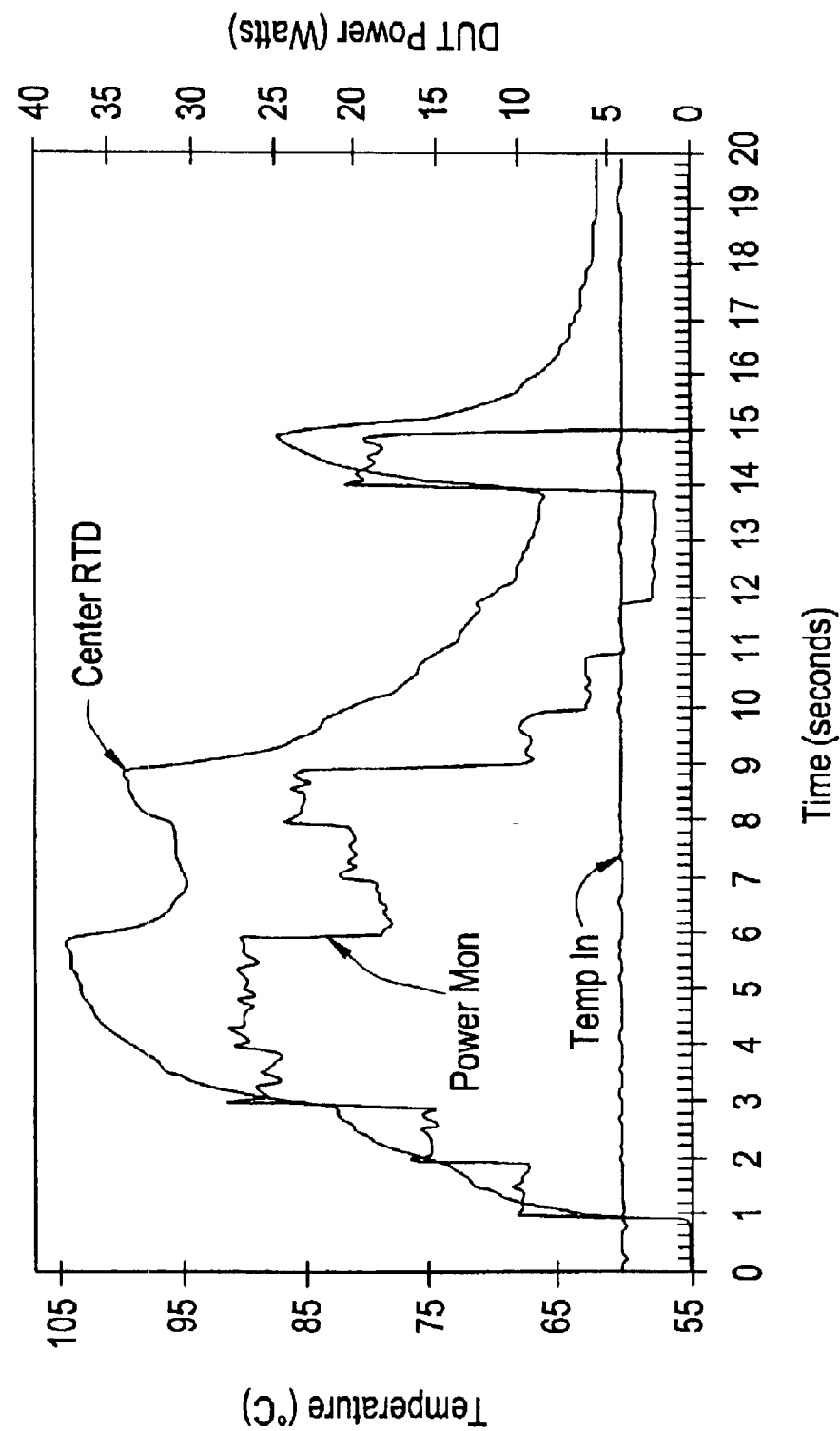
FIG. 6 contains a graph illustrating the performance of a simple conduction system.

Conduction systems, while offering a potential advantage over convection systems, have also proven ineffective. Referring to FIG. 6, there is shown the performance of simple conduction on a flip chip device. As the power drawn by the device increases, the temperature also increases well in excess of the nominal temperature of approximately sixty degrees C.

A true solution requires an ability to quickly detect a DUT's temperature and an ability to respond quickly and effectively to changes in the DUT temperature.

Figure 7:
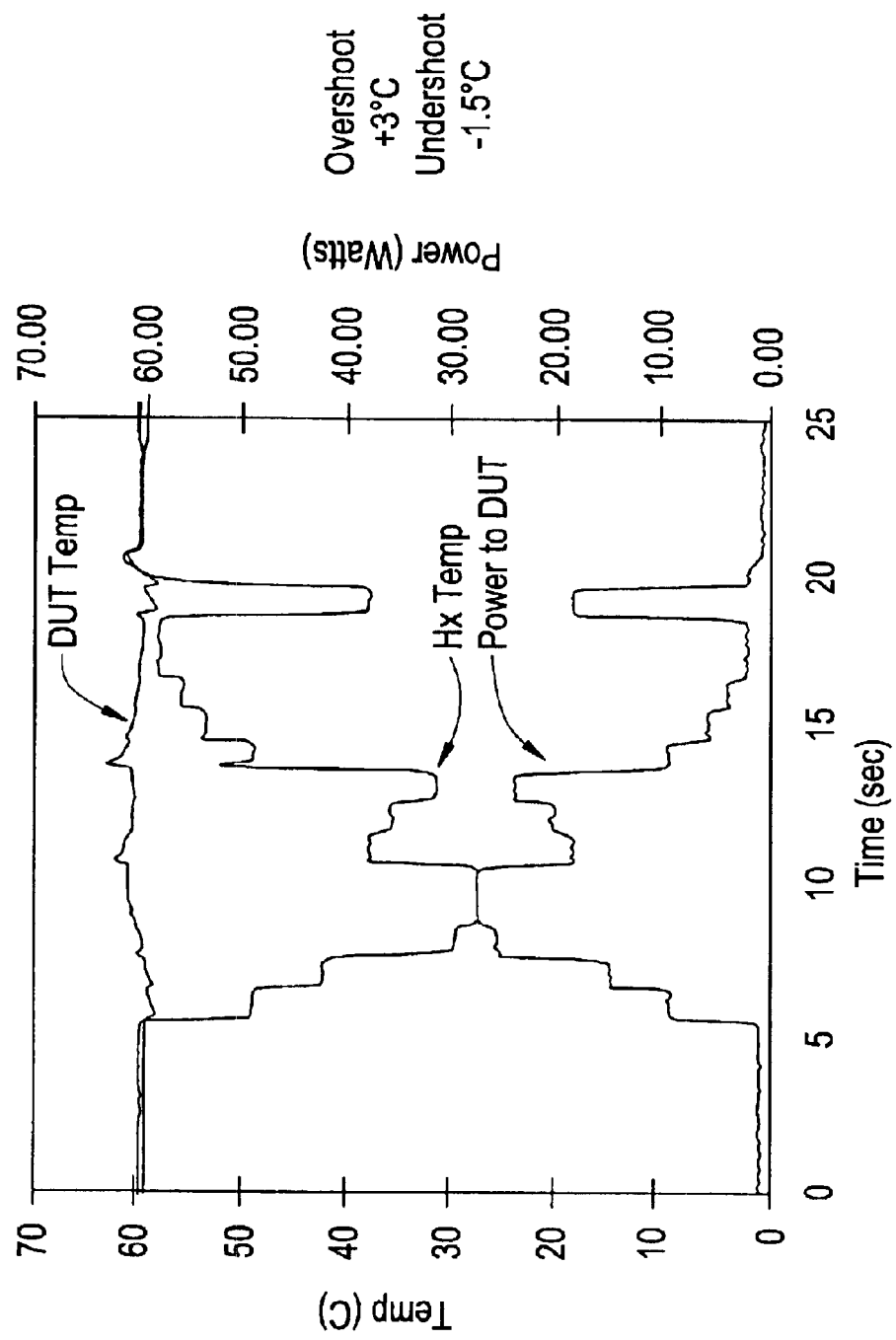
FIG. 7 contains a graph illustrating the performance of power following temperature control according to an embodiment of the present invention.

As described in this application, both requirements are addressed by the disclosed invention. They provide a mechanism for quickly determining the DUT temperature by using a newly developed power-following feedback technique. The disclosures also provide a heat source/sink (generically, a heat exchanger ("Hx")) that can respond quickly and effectively to offset the self-heating of the DUT. Referring to FIG. 7, there is shown a reduced overshoot in the DUT temperature effected in part by the rapid response to the determined DUT temperature. This response is shown by the heat exchanger temperature reflecting, with a reverse image, the power to the DUT.

The power-following feedback method which is used for determining the DUT temperature also has the advantage of working in real time, so that test sequences can be optimized without the need for changing thermal conditioning, and without the thermal conditioning limiting test program flexibility. A key feature is the development and use of a simplified equation which allows the derivation of a DUT temperature from the power measurements.

While a measurement, also called a calculation, of the total power usage of a DUT is desirable, it will be clear to those skilled in the relevant art, in light of the present disclosure, that this will not always be necessary. Clearly, there will be embodiments in which part of the power could be estimated or ignored. This may occur, for example and without limitation, if all of a device's power fluctuations are isolated to a particular voltage or power supply, or if a particular power supply provides a comparatively small amount of power to the device.

Further, monitoring the power supplies is a convenient method of monitoring power usage because the connections are removed from the DUT and because it senses the instantaneous power fluctuations before the actual change in self-heating occurs. Note that these power fluctuations may be increases or decreases and may give rise to increases or decreases in self-heating. However, those of ordinary skill in the art will appreciate that there are other methods of monitoring power, current, and/or voltage.

2. Power Following System

FIG. 1A illustrates an embodiment of the present invention. A monitoring circuit 10 monitors power usage from one or more power supplies 15 which supply power to an electronic device (not shown) under test or in operation. If there is a plurality of power supplies 15, then the monitor circuit 10 sums the total power usage. An electrical connection point 16 links the monitor circuit 10 to each power supply 15. The electrical connection point 16 provides the monitor circuit 10 with indication of the power usage of the electronic device, such as a voltage image of the current through the electronic device and a voltage level at which the electronic device is being operated or tested. Electrical connection points 16 are available in power supplies of automated test equipment used to test electronic devices. The monitor circuit 10 sends a power usage signal 20 (a voltage representing the value of the power usage) to a thermal control circuit 25.

Based on a given chip set point temperature or a signal representing the set point temperature 30, and a forcing system surface temperature or a signal representing the forcing system surface temperature 32, the thermal control circuit 25 translates the power usage signal 20 into a temperature control signal 35. The thermal control circuit 25 sends the temperature control signal 35 to a heat exchanger temperature control 40. The heat exchanger temperature control 40 contains a heat exchanger power supply (not shown) with a power amplifier and controls temperature to a heat exchanger 45 for the electronic device under test or operation by adjusting the output current of the heat exchanger power supply. The resulting temperature of the heat exchanger is the forcing system surface temperature 32.

Figure 1B:
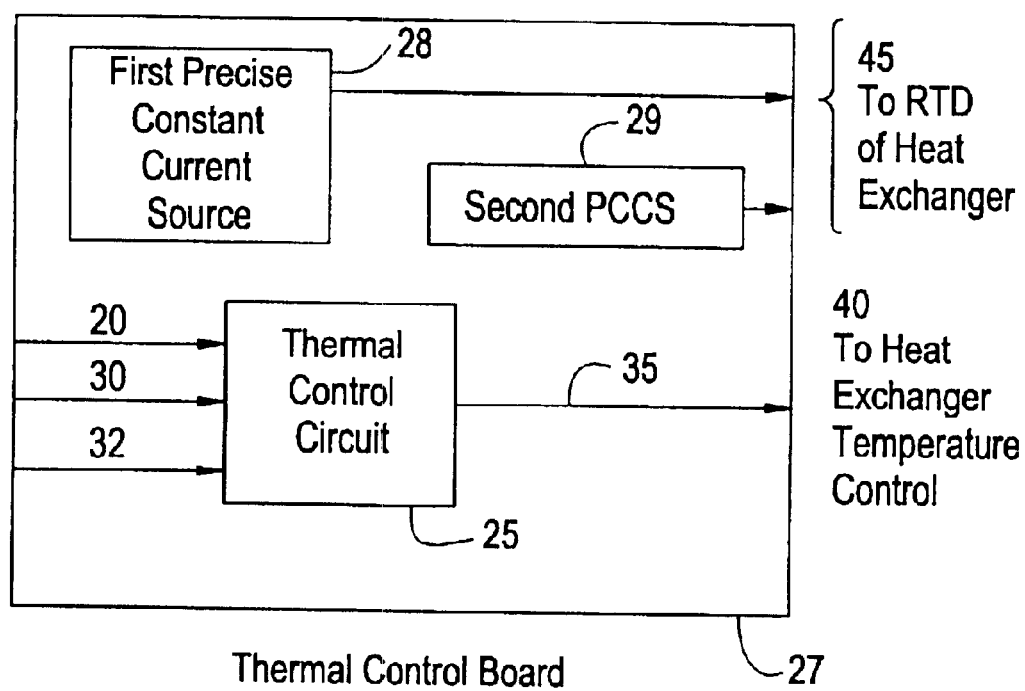
FIG. 1B is a block diagram illustrating several principle components of a thermal control board according to an embodiment of the present invention.

Referring to FIG. 1B, the thermal control circuit 25 resides on a thermal control board 27. The thermal control board 27 also contains, among other components, a first precise constant current source 28 and a second precise constant current source 29. The first precise constant current source 28 sends a precise constant current from the thermal control board 27 to a variable resistance device ("RTD") in the heat exchanger 45. The RTD responds to the forcing system surface temperature and outputs a voltage representing the forcing system surface temperature 32. The forcing system surface temperature voltage 33 feeds back into the thermal control circuit 25. Placing the first precise constant current source 28 off of the heat exchanger 45 provides an advantage in that the heat exchanger can be replaced more easily.

The second precise constant current source 29 is able to send a precise constant current to the DUT. The heat exchanger 45 is further described in the section on the Temperature Control Unit below.

The present invention can be used in conjunction with the techniques and apparatus described in co-pending provisional patent application U.S. Ser. No. 60/092,715 to Jones et al.

As one skilled in the relevant art will readily appreciate, in light of the present and incorporated disclosures, the functions of the overall system can be implemented with a variety of techniques. Electrical circuits are disclosed herein for the monitoring circuit and the thermal control circuit, but other implementations are possible for these functions, as well as for others such as producing the signals representing the current, voltage, temperature, and power.

In accordance with an aspect of the present invention, the functionality disclosed herein can be implemented by hardware, software, and/or a combination of both. Software implementations can be written in any suitable language, including without limitation high-level programming languages such as C++, mid-level and low-level languages, assembly languages, and application-specific or device-specific languages. Such software can run on a general purpose computer such as a 486 or a Pentium, an application specific piece of hardware, or other suitable device.

In addition to using discrete hardware components in a logic circuit, the required logic may also be performed by an application specific integrated circuit ("ASIC") or other device. The technique may use analog circuitry, digital circuitry, or a combination of both. The system will also include various hardware components which are well known in the art, such as connectors, cables, and the like. Moreover, at least part of this functionality may be embodied in computer readable media (also referred to as computer program products), such as magnetic, magnetic-optical, and optical media, used in programming an information-processing apparatus to perform in accordance with the invention. This functionality also may be embodied in computer readable media, or computer program products, such as a transmitted waveform to be used in transmitting the information or functionality.

Further, the present disclosure should make it clear to one skilled in the art that the present invention can be applied to a variety of different fields, applications, industries, and technologies. The present invention can be used, without limitation, with any powered system in which temperature must either be monitored or controlled. This includes without limitation many different processes and applications involved in semiconductor fabrication, testing, and operation.

Additionally, the preferred embodiment calculates, or monitors, the power which is supplied to a DUT from a power supply. This power is typically provided to a power plane or grid of some sort on the DUT, through one or more power connections in the DUT. This is to be differentiated from the power inherent in any signal. Clearly, any signal connection on a device is designed to receive the specified power of that signal, for example a clock signal. However, the power which the preferred embodiment monitors is the power provided from a power supply to the power connections, and not the power inherent in a signal which might be supplied to a signal connection. A power supply, as used above, refers to a standard industry device which can supply electrical power at a specified voltage for operating a device. It should be clear, however, that the techniques of the present invention could be applied to any signal, including without limitation a power signal, a clock signal, and a data signal. These techniques could also be applied to non-standard power supplies.

3. The Monitoring Circuit Summing Function

Figure 2:
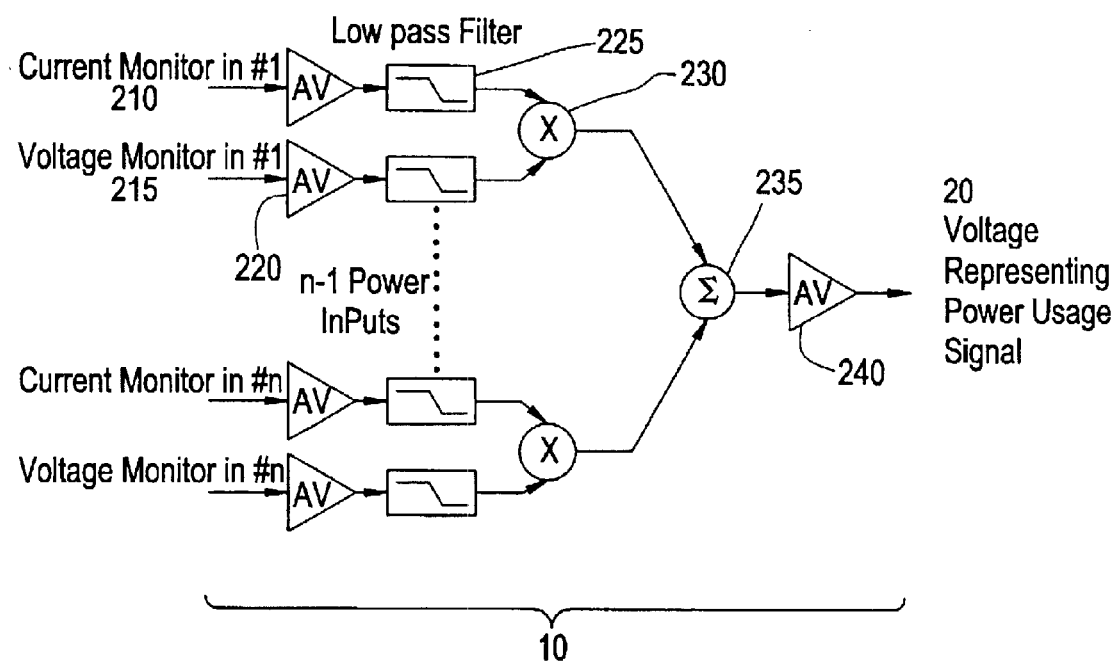
FIG. 2 is a block diagram illustrating the power computation and monitoring circuit of an embodiment of the present invention.

FIG. 2 is a block diagram illustrating the calculating function of the monitoring circuit 10 in an embodiment of the present invention where the electronic device is supplied power from a plurality of power devices 15. Each electrical connection 16 (not shown in FIG. 2, see FIG. 1A) sends current 210 and voltage signals 215 from its corresponding power supply 15 (not shown in FIG. 2, see FIG. 1A) to the monitor circuit 10. Each current and voltage signal 210, 215 passes through a respective first amplifier 220, where it is amplified and into a low pass filter 225 which removes wide-band noise and high frequency components of the signal. The current and voltage signals 210, 215 may be in the form of voltages representing the values of the respective current or voltage.

The thermal components of the system respond more slowly (e.g. milliseconds) than does the power supplied to the electronic device under test (e.g. nanoseconds). Accordingly, the high frequency components of the current and voltage signals 210, 215 add no value. Removing the high frequency components of the current and voltage signals 210, 215 matches the bandwidth of the current and voltage signals 210, 215 to the bandwidth of the rest of the control circuit and simplifies the task of stabilizing the temperature control.

The current and voltage signals 210, 215 for a particular power supply then pass together into a first multiplying circuit 230, which uses the current and voltage signals 210, 215 to calculate power usage for that particular power supply.

For every power supply, the monitoring circuit 10 uses the following equation to calculate the power usage from the current and voltage signals 210, 215:

$$P = I * V \quad \text{(Eqn. 1)}$$

Where:

P=power usage in watts
I=current signal in amps
V=voltage signal in volts.

If the power supply 15 provides a voltage image of the current being drawn by the electronic device, then a scaling factor is required which describes the volts-to-amps relationship of the voltage image signal. If the electronic device is being tested, the scaling factor is derived from characteristics of the power supply to the automatic test equipment (also powering the electronic device under operation or test) being used to test the electronic device. For example, the scaling factor of Schlumberger's VHCDPS is 1.0, while the scaling factor of Schlumberger's HCDPS is 0.87. The scaling factor is made available to the monitoring circuit to allow the conversion of the signal in volts to a corresponding current value in amps.

The scaling factor can also be determined empirically with the formula:

Scaling factor=Signal Volts/Measured Amps.

This could be done by measuring the actual current and the signal voltage simultaneously, and then dividing the voltage by the measured amperage. Certain embodiments may also allow the setting of one or more specific current outputs and then measuring the signal voltage(s).

The output from all the first multiplying circuits 230 pass into a single summing circuit 235, which sums the power usage from all of the power supplies into the power usage signal 20. The power usage signal 20 may be in the form of a voltage representing that value and passes through a second amplifier 240 before leaving the monitoring circuit and going on to the thermal control circuit as the power usage signal 20.

4. The Thermal Control Circuit

Figure 3:
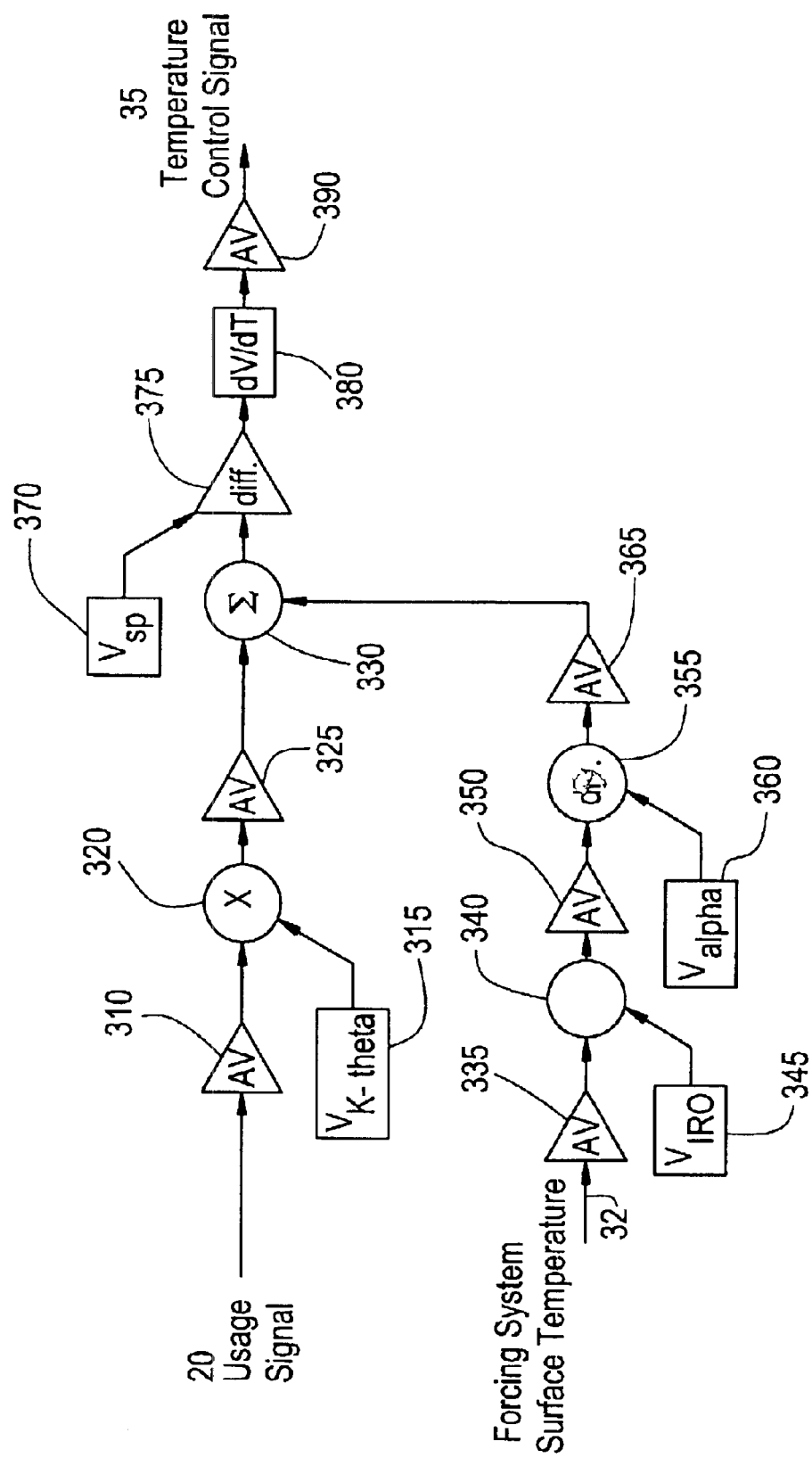
FIG. 3 is a block diagram illustrating the thermal control circuit of an embodiment of the present invention.

FIG. 3 is a block diagram illustrating the thermal control circuit of the present invention. The temperature of the electronic device being tested or under operation can be determined using the following equation:

$$\text{Chip temperature} = K_{theta} * P_{ed} + T_{fss} \quad \text{(Eqn. 2)}$$

Where:

Chip temperature (° C.) represents the chip temperature derived from its power dissipation.

$K_{theta}$ is a constant (° C./watts) derived from the capabilities of the temperature forcing system and the thermal resistance of the medium (or media, in those cases where heat spreaders, lids, or other devices are attached to the top of the device itself) between the electronic device and the heat exchanger.

$P_{ed}$ (watts) is the total power usage, reflected in the power usage signal 20 obtained from the monitoring circuit 10 (see FIG. 1A).

$T_{fss}$ (° C.) is the system surface forcing temperature and is the absolute temperature of the medium contacting the chip, as measured by a temperature sensor embedded in the thermal control system surface.

$K_{theta}$ is also derived from the general efficiency of the thermal control system when in contact with the DUT. For example, at setpoint temperatures well above ambient, the DUT loses proportionally more heat to its surroundings, and the thermal control system must work harder to raise DUT temperature than to lower it. From the standpoint of a thermal control system responding to DUT self-heating, the overall effect is the same as a lower thermal resistance between the DUT and the heat exchanger operating at an ambient setpoint. Similarly, at setpoint temperatures well below ambient, the DUT gains heat from its surroundings, and the thermal control system must work harder to lower temperature than to raise it. From the standpoint of a thermal control system responding to DUT self-heating, the overall effect is the same as a higher thermal resistance between the DUT and the heat exchanger operating at an ambient setpoint. In both cases, $K_{theta}$ is adjusted to reflect the effect of heat transfer to the DUT's surrounding environment during power excursions.

$K_{theta}$ may be considered an effective or a fine-tuned thermal resistance of the medium. Although the thermal resistance of different media are set out in standard chemistry reference books (such as *CRC Handbook of Chemistry* and *Physics,* 77th Edition; David R. Lide, Editor-in-Chief), factors such as ambient humidity, pressure, and temperature may affect the actual thermal resistance. Thermal resistance may also be affected by the physical configuration of the test. To determine $K_{theta}$ one can use a calibration process to adjust the value of the anticipated thermal resistance of the medium and ascertain whether the result is an improvement. Another advantage of a calibration process is that it will automatically account for the "efficiency factor" of the heat transfer from the DUT to the thermal control system as a function of the setpoint temperature.

As described above, $K_{theta}$ offers the advantage of incorporating the effects of a variety of variables into one term. In the preferred embodiment, $K_{theta}$ only needs to be optimized for a given application, or type of DUT, and then can be used to test many different devices of the same type. Additionally, one practical effect of $K_{theta}$ is that in mirroring the monitored power consumption of the device with the temperature of the temperature forcing system (see FIG. 7), $K_{theta}$ magnifies or compresses the relative magnitude of the mirroring.

In the thermal summing circuit 330, the temperature control signal 35 is determined using the following equation:

$$V_{tcs} = d(Vsp - ((V_{k\text{-}theta} * V_{Ped}) + (V_{fsst} - V_{IRO})/V_{alpha}))/dt \quad \text{(Eqn. 3)}$$

Where:

$V_{tcs}$ is the temperature control signal.
$V_{sp}$ is a set point temperature voltage 375, a voltage representing the set point temperature for the electronic device.
$V_{k\text{-}theta}$ is a voltage 315 representing the $K_{theta}$ value. The $K_{theta}$ value is inputted into a digital to analog converter, which generates a voltage corresponding to the value of the input.
$V_{Ped}$ is the total power usage signal 20 obtained from the monitoring circuit 10 (see FIG. 1A) and which represents the watts consumed by the DUT.
$V_{fsst}$ is the forcing system surface temperature voltage 32 generated by digital to analog conversion and representing the forcing system surface temperature.
$V_{IRO}$ 345 is a voltage generated by digital to analog conversion which represents a voltage equal to the value of the precise constant current from the first precise constant current source 28 in the thermal control board 27 multiplied by the resistance shown by the variable resistance device in the heat exchanger at 0 degrees C. This can be determined when the embedded temperature sensor in the heat exchanger is calibrated.
$V_{alpha}$ 360 is a voltage generated by digital to analog conversion and represented the slope of a curve for the variable resistance device in the heat exchanger of resistance versus temperature. This can be determined when the embedded temperature sensor in the heat exchanger is calibrated.

Referring to FIG. 3, the power usage signal 20 from the monitoring circuit 10 (not shown in FIG. 3) enters the thermal control circuit 25 by passing through a third amplifier 310. From there, the power usage signal 20 passes into a second multiplying circuit 320 where it is multiplied with a $V_{k\text{-}theta}$ 315 to create a first modified signal. The modified power usage signal then passes into a fourth amplifier 325 and from there into a thermal summing circuit 330. The voltage representing forcing system surface temperature $V_{fsst}$ 32 also enters the thermal control circuit 25 by passing through a fifth amplifier 335. From there, $V_{fsst}$ 32 passes into a subtracting circuit 340 where $V_{IRO}$ 345 is subtracted from $V_{fsst}$ 32 for a calibrated $V_{fsst}$. The calibrated $V_{fsst}$ passes through a sixth amplifier 350 and into a divisional circuit 355, where the calibrated $V_{fsst}$ is divided by $V_{alpha}$ 360. A result representing $(V_{fsst} - V_{IRO})/V_{alpha}$ passes through a seventh amplifier 365 and from there passes into the thermal summing circuit 330, and is summed there with the modified power usage signal to yield a summation. The summation passes into a difference circuit (or subtraction circuit) 375, which subtracts the summation from the set point temperature voltage 370 to yield a resulting signal. This signal represents the instantaneous temperature error.

The resulting signal passes into a derivative circuit 380 which takes the derivative of the resulting circuit with respect to time and smoothes it out. The derivative signal is amplified by a sixth amplifier 390 before leaving the thermal control circuit as the temperature control signal $V_{tcs}$ 35.

The derivative circuit 380 represents the overall control section of the thermal control circuit 25. This is where the circuit's response time to instantaneous signal level changes is determined. Although characterized by the derivative circuit 380, the control circuit 25 can be described as a PI style control loop because there is a proportional and integral gain stage in the control circuit 25.

Other embodiments may use true PID control by, for example, either designing a custom system or using an off the shelf commercial servo controller. Such a system adds capabilities like continuous ramping, s-curve profiling, servo tuning for minimal overshoot and undershoot, and improved closed-loop control stability. Depending upon the particular controller used, the PID controller may need to convert the temperature signals and the power signal to some sort of thermal position signal, and feed it back into a commercial servomotor controller. Some controllers may also need to do some conversion on the back end. As these examples indicate, the control functions required can be performed by analog and/or digital circuits.

5. Graphic Example

Figure 4:
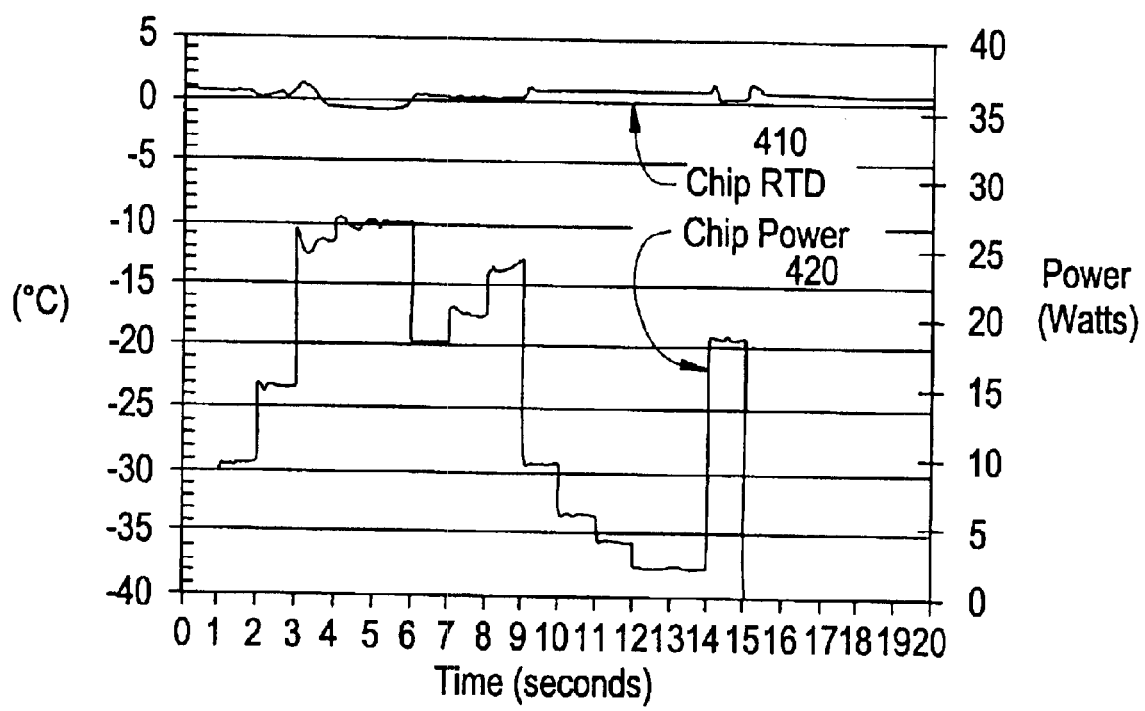
FIG. 4 is a graph illustrating the results of power following temperature control according to an embodiment of the present invention.

FIG. 4 is a graph illustrating an example of the power following temperature control of the present invention. The graph illustrates that the temperature of the electronic device 410 can be kept fairly constant even with wider swings in the amount of power 420 used by the electronic device.

6. Test Control and Temperature Determination

As described in the disclosure, a control system maintains the DUT temperature at a specified set point within a given tolerance. The control system must therefore have some information on the DUT temperature. Some control systems, such as direct temperature following, require repeated DUT temperature information. Other control systems, such as power following, which control deviation from a set point, do not need repeated DUT temperature information but only need to know when to begin the temperature maintenance process.

In one embodiment, the power following process begins after the DUT has reached the set point temperature. This information may be determined indirectly, for example, after a soak timer has expired. It may also be determined directly, for example, by monitoring a thermal structure. Thermal structures can be used to supply initial DUT temperature information and they can also be monitored throughout the test if they are properly calibrated. One embodiment of the present invention monitors thermal structures to determine the initial DUT temperature before initiating a power following temperature control method.

Preferably, the characterization and validation process is performed for the power following temperature control of a particular type of DUT. This process utilizes die temperature information. If a statistically relevant sample set is taken with true die temperature information during the calibration process, then no temperature sensing device in the die is necessary during high volume manufacturing and testing.

Figure 9:
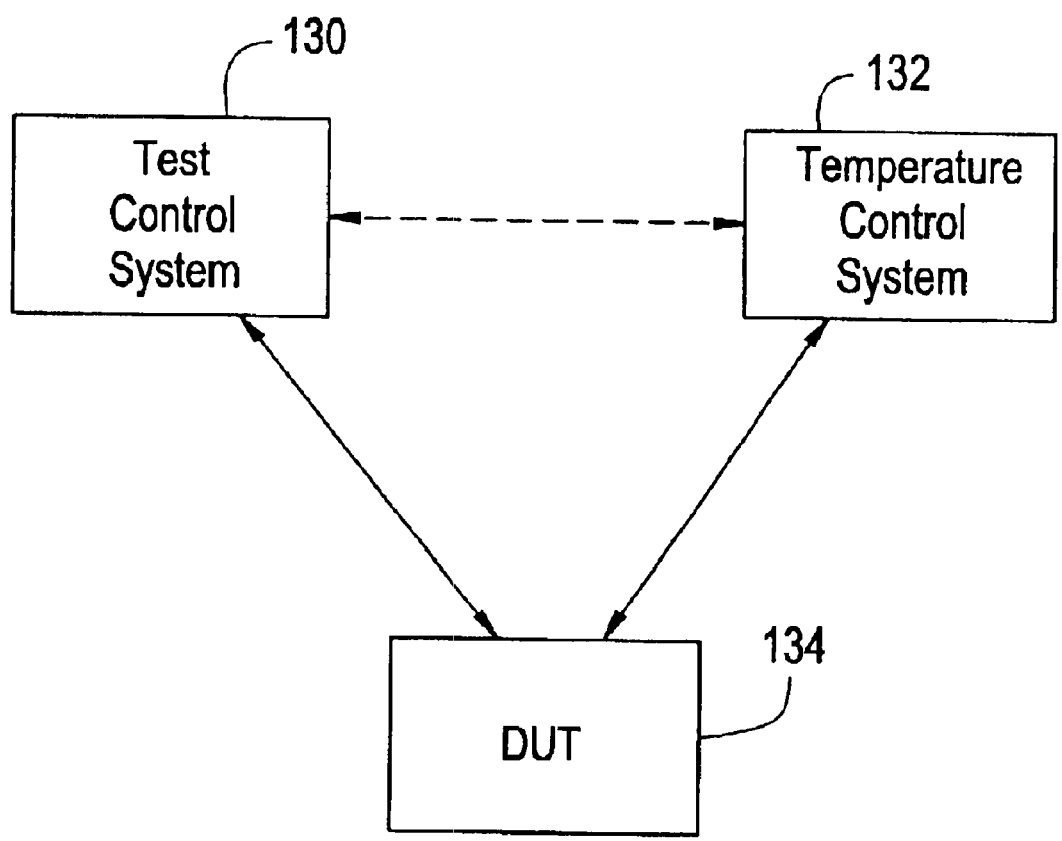
FIG. 9 is a high-level block diagram showing an interrelationship between a test control system, a temperature control system, and a device.

Embodiments of the present invention may include separate control sections to control the temperature and to control the test sequence. Referring to FIG. 9, there is shown a generic high-level block diagram illustrating a test control system 130 and temperature control system 132, both of which are connected to and communicate with a DUT 134. This disclosure has been primarily concerned with describing the temperature control system 132. The test control system 130 would operate the appropriate tests on the DUT 134 while the temperature control system 132 controlled the DUT temperature.

These two control systems 130, 132 need to communicate or otherwise coordinate their activities. Either the temperature control system 132 or the test control system 130 can monitor a thermal structure. In one embodiment of the present invention, the test control system 130 monitors the thermal structure of the DUT 134 and sends a signal, such as a scaled voltage, to the temperature control system 132 indicating the DUT temperature. FIG. 9 shows the communication path of such an embodiment with a dashed line between the test control system 130 and the temperature control system 132. Embodiments of the control systems and their architecture may vary considerably. In one embodiment, the two control systems 130, 132 are separate and have no direct communication. Both control systems 130, 132 monitor the DUT 134 to gain the necessary DUT temperature information in order to coordinate their activities. In a second embodiment, the two control systems 130, 132 are fully integrated.

7. Data Acquisition

The information which the above-described power following system utilizes is information on the power draw of a DUT. In one described embodiment, this information is the scaled voltage image of current and voltage signals, as depicted in FIG. 1A. These signals are supplied by the power supply(s) 15 of FIG. 1A. This information can also be made available for other purposes, with a data generation system. Such a data generation system may display the power information such as with plots or graphs, perform calculations based on it for a variety of applications, monitor performance or efficiency, and store the data, to name a few of the possibilities. Various data generation systems are shown in FIGS. 10A–10C.

Figure 10A:
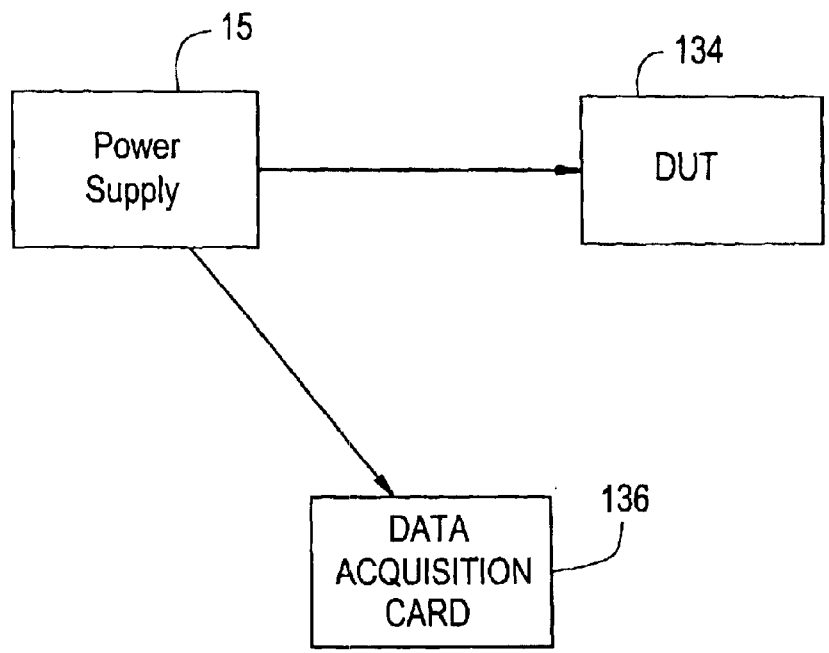
FIGS. 10A–10C are high-level block diagrams showing the acquisition and use of device power information.
Figure 10B:
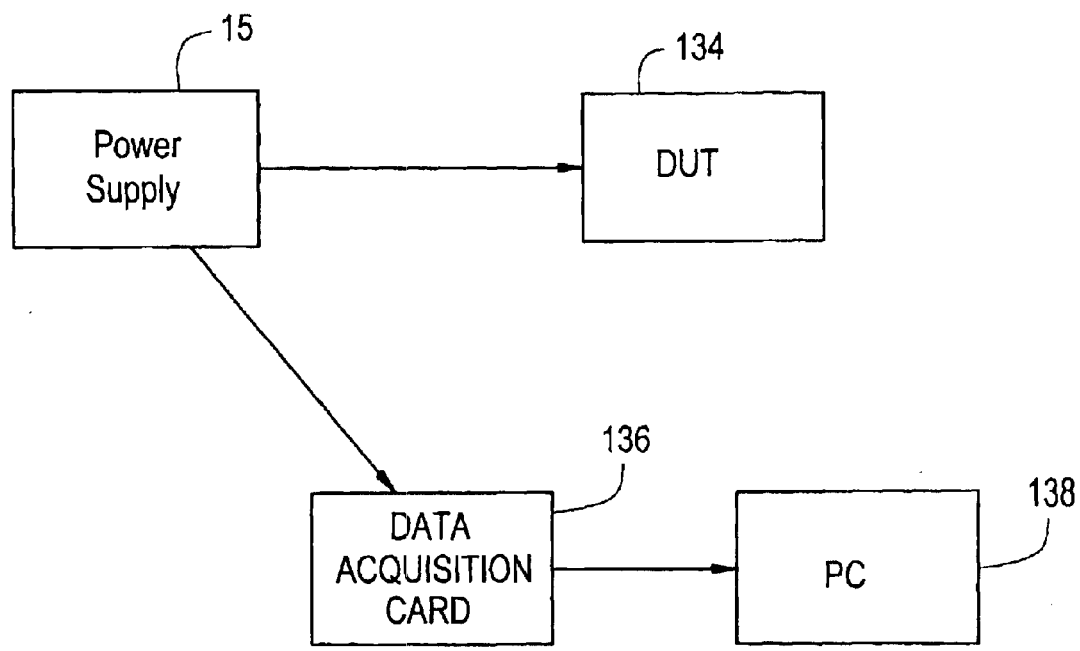

Referring to FIG. 10A, there is shown a power supply 15 supplying power to a DUT 134. The power supply is preferably a programmable power supply. There is also shown a data acquisition card 136, more generally referred to as a data acquisition device, which receives power information, such as the scaled voltage images of the current and voltage signals from the power supply 15. In certain embodiments, the data acquisition card 136 can receive the same information that the monitoring circuit 10 of FIG. 1A receives. That signal (connecting the power supply 15 to the monitoring circuit 10 through connection 16, in FIG. 1A) can be supplied to the data acquisition card 136 in a variety of methods known in the industry, including without limitation, splitting the line, or daisy-chaining the data acquisition card 136 to the monitoring circuit 10.

Figure 10C:
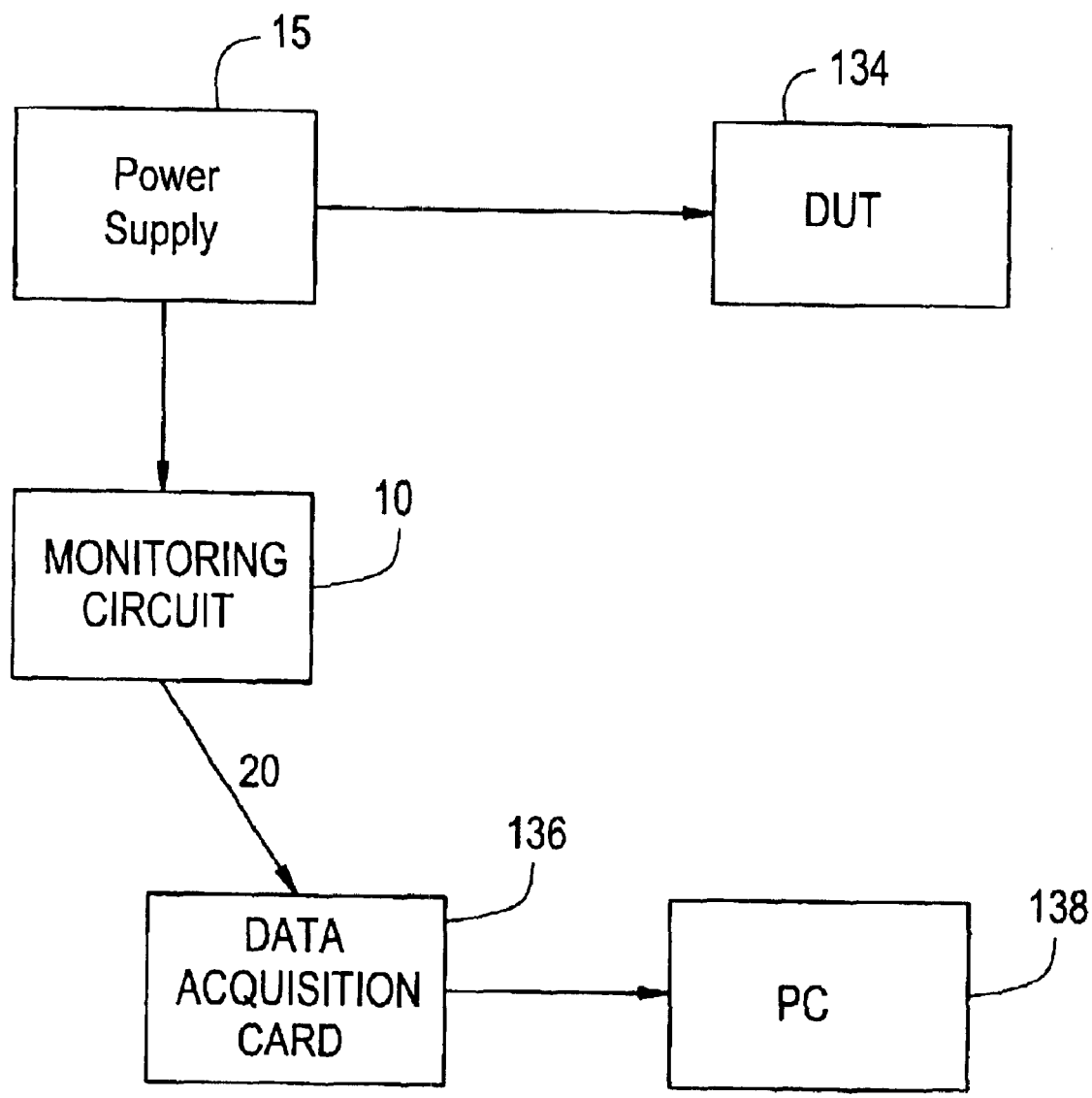

Referring to FIG. 10C, the monitoring circuit 10 is preferably disposed between the power supply 15 and the data acquisition card 136. The data acquisition card 136 then receives the power use signal 20 from the monitoring circuit 10. In this embodiment, the data acquisition card 136 acquires the power use signal 20 directly instead of having to either perform the calculations itself or rely on another device or processor to perform them. Various power usage signals 20, scaled voltage images of the power, are depicted in FIG. 4 (Chip Power), FIG. 5 (Actual Pwr), FIG. 6 (Power Mon), and FIG. 7 (Power to DUT). In these figures, the signals were acquired by data acquisition cards 136.

The data acquisition card 136 may utilize analog and/or digital circuitry. Preferably the data acquisition card 136 contains an analog-to-digital converter with multiple channels. One embodiment uses an off-the-shelf board, model number PCI-6031E made by National Instruments, for the data acquisition card 136.

The data acquisition card 136 may also perform a variety of control functions, such as setting the sampling rate and other parameters. In a preferred embodiment, however, the data acquisition card 136 sends the data to another controller. In each of FIGS. 10B and 10C, there is shown a general purpose personal computer ("PC") 138 which serves as the controller and sets a variety of values on the data acquisition card 136. In one embodiment, the PC 138 receives digitized data from the data acquisition card 136 and the PC 138 can then perform a variety of services and functions with the data. In one embodiment, the data can be stored on a digital storage medium such as, for example, a hard disk, floppy disk, optical disk, ZIP disk, or Bernoulli drive. The data can also be transmitted, displayed on a display device such as a computer screen, or processed. Other embodiments may also encompass additional processors or equipment, including analog equipment, which utilize the data.

Preferably, the PC 138 includes a Pentium processor and uses the Windows NT operating system. Various communications cards and protocols can be used between the PC 138 and the data acquisition card 136, including without limitation, a universal asynchronous receiver transmitter ("UART"), a universal receiver transmitter ("URT"), and the RS-232 standard.

In a preferred embodiment, the data acquisition card 136 also acquires various other information, including without limitation, DUT temperature information, heat exchanger power information, coolant flow rates, and fluid inlet and outlet temperatures.

8. Temperature Control Unit

Figure 11:
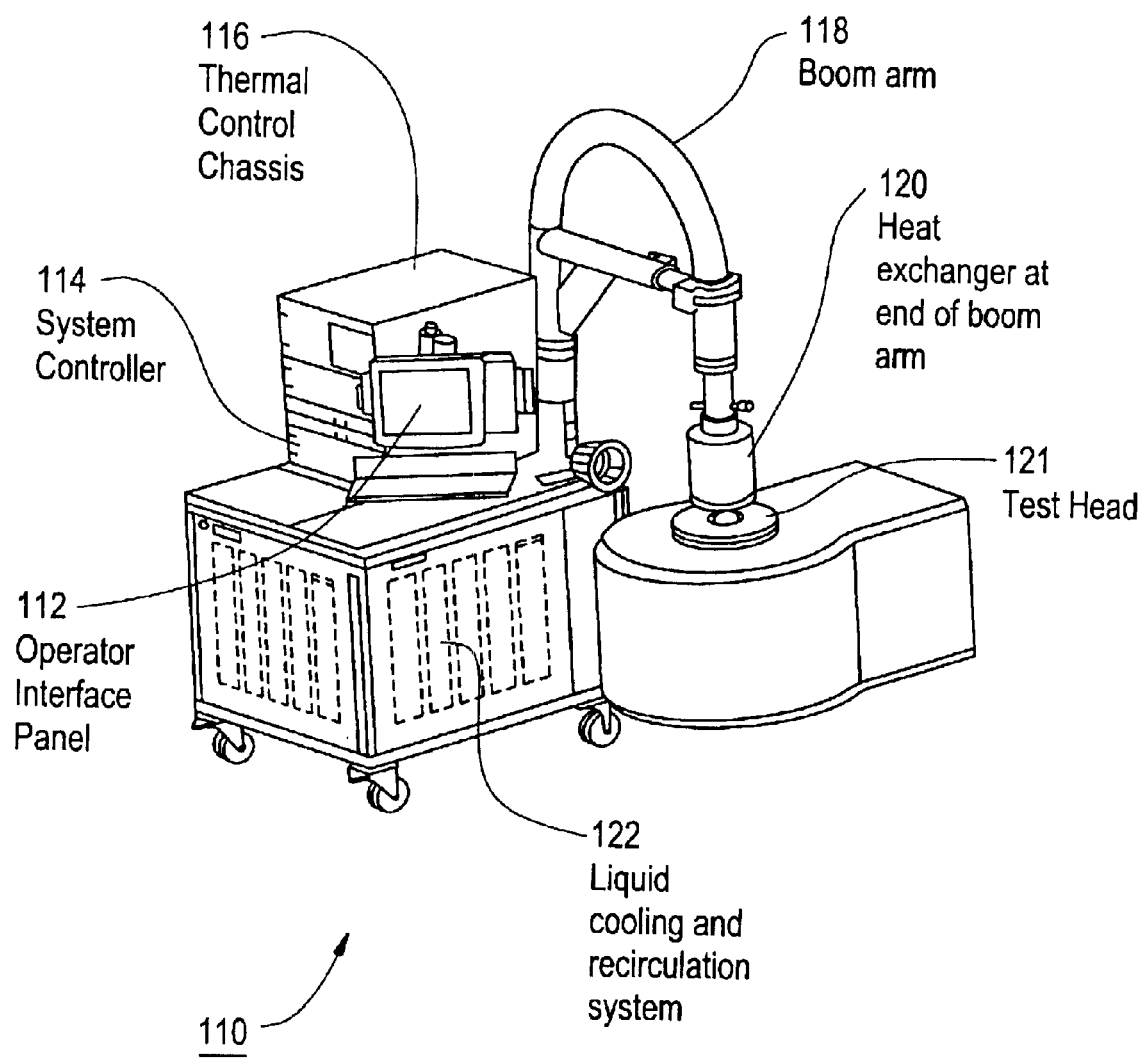
FIG. 11 illustrates a thermal control unit.

FIG. 11 shows a general diagram of a system 110 according to the present invention. As shown, the user operates the system 110 at the operator interface panel 112. The operator interface panel 112 serves as an interface to the system controller 114. The system controller 114 is housed in the thermal control chassis 116 and controls the heat exchanger 120 and the liquid cooling and recirculation system 122.

The heat exchanger 120 preferably includes a heater and a heat sink. Other heat exchangers are possible, however. The heat sink preferably contains a chamber through which the liquid is pumped. Other heat sinks are also possible. Heat sinks, or heat sink systems, with no liquid are also viable if the thermal conductivity is high enough. In particular, solid heat sinks such as Peltier devices are known in the art which use electrical signals through the material to control temperature and temperature gradients. A heat sink may also be equivalently referred to as a heat transfer unit, thus focusing attention on the fact that the heat sink may also act as a heat source.

The heater of the heat exchanger 120 is preferably a three layer co-fired aluminum nitride heater substrate with a heater trace between the first two layers and the RTD trace between the last two layers. The heater trace provides the heating and the RTD trace provides temperature information. The two traces are electrically isolated while being at essentially the same thermal position due to the thermal conductivity of the aluminum nitride layers.

In discussing the temperature of a heater, or heat sink or other device, it is to be understood that the temperature of a single point on the device is being discussed. This follows from the fact that a typical heater, or heat sink or other device, will have a temperature gradient across the surface. In the case of a heater, the existence of a gradient is due, in part, to the fact that the heating element usually occupies only a portion of the heater.

The liquid cooling and recirculation system 122 supplies a liquid to the heat exchanger 120, specifically to the heat sink, through the boom arm 118. The boom arm 118 also carries the control signals from the system controller 114 to the heater.

A test head 121 is adapted to be positioned under the heat exchanger 120. The test head 121 preferably contains a test socket which is used for mating with a device under test ("DUT") such as a chip. Testing of the DUT can then be performed through the test head 121 and the temperature of the DUT can also be regulated during the testing. During temperature regulation the DUT is preferably in conductive contact with the heat exchanger 120.

9. Modifications and Benefits

Embodiments of the present invention can include a time delay or filtering on the power usage signal 20, or elsewhere, to adjust the effect of power compensation with respect to time. This might be used, for example, to offset the effects of a big ceramic substrate or other large thermal heat sink, or to average out the effects of a high frequency power signal without eliminating them. A time delay or filter would become more important as testers and microprocessors become faster.

Other embodiments may also compensate for large bypass capacitance on a tester interface board or a DUT itself. Bypass capacitance is used to supply instantaneous charge which the power supply cannot replenish fast enough, due to inductive loading or physical distance. As the bypass capacitance increases, the time between the power supply signal and the DUT self-heating will decrease.

While the embodiment described above uses analog design techniques, a digital signal processor and software could be used in an alternative embodiment of the invention to effect this digitally.

The benefits of the present invention include providing an apparatus and method of temperature control for electronic devices which can respond to the temperature of the electronic device, instead of the package. A further benefit of the present invention is that it provides an apparatus and method of temperature control for electronic devices which can conveniently be used for high volume chip manufacturing. A further benefit of the present invention is that it provides an apparatus and method of temperature control for electronic devices which is reliable.

A further benefit of the present invention is that it provides an apparatus and method of temperature control for electronic device which does not require significant surface area of the electronic device for sensing the device temperature, although the system does require surface area for conduction. Another benefit of the present invention is that it eliminates the need for temperature sensing devices to be integrated into the chip or to be temporarily connected to the chip.

Yet another benefit is that the present invention also eliminates the need to collect, maintain, and apply the use of chip power profiles, as well as eliminating the need for the capability in the automated test equipment, temperature forcing system and testing software to collect and apply chip power profiles.

The principles, preferred embodiments, and modes of operation of the present invention have been described in the foregoing specification. The invention is not to be construed as limited to the particular forms disclosed, because these are regarded as illustrative rather than restrictive. Moreover, variations and changes may be made by those of ordinary skill in the art without departing from the spirit and scope of the invention.

What is claimed is:

1. A method for controlling a temperature of a device during testing with a thermal controller and a heat exchanger, the method comprising:

measuring an instantaneous power consumption of the device during testing; and controlling the heat exchanger with the thermal controller using the measured instantaneous power consumption by the device to regulate the temperature of the device during testing, wherein the heat exchanger is in conductive contact with the device.

2. The method of claim 1, wherein the device is an integrated circuit device.

3. The method of claim 1, wherein the heat exchanger is conductively coupled to the device, the heat exchanger being responsive to changes in the measured instantaneous power consumption by the device to regulate the temperature of the device.

4. The method of claim 3, wherein the heat exchanger comprises a heat sink having a surface on which a heater element is incorporated, the heat sink removing heat from the device when the temperature of the device exceeds a temperature below a predetermined set-point temperature, and the heater element is controlled based on the measured instantaneous power consumption by the device to selectively introduce heat to maintain the device near the predetermined set-point.

5. The method of claim 1, wherein measuring the instantaneous power consumption includes measuring the current provided to the device while the device is being tested.

6. A method for controlling a temperature of a device during testing with a thermal controller and a heat exchanger, the method comprising:

receiving in real-time data corresponding to the power being supplied by the programmable power supply to the device under test; and controlling the beat exchanger with the thermal controller using the received real-time data to regulate the temperature of the device during testing, wherein the heat exchanger is in conductive contact with the device.

7. The method of claim 6, wherein the received data is an analog signal and the method further comprises:

processing the received data to produce a power signal which indicates the power being used by the device under test;

supplying the power signal to a data acquisition device;

sampling the power signal by the data acquisition device; and providing the sampled power signal from the data acquisition device to a computer.

8. The method of claim 6, wherein the device is an integrated circuit device.

9. The method of claim 6, wherein the heat exchanger is conductively coupled to the electronic device, the heat exchanger being responsive to changes in the received real-time data to regulate the temperature of the device.

10. The method of claim 9, wherein the heat exchanger comprises a heat sink having a surface on which a heater element is incorporated, the heat sink removing heat from the device when the temperature of the device exceeds a temperature below a predetermined set-point temperature, and the heater element is controlled based on the received real-time data to selectively introduce heat to maintain the device near the predetermined set-point.

11. The method of claim 6, wherein the received real-time data includes a measurement of the current provided to the device while the device is being tested.

12. A system for controlling a temperature of a device under test, comprising:
a measuring device for measuring an instantaneous power consumption by the device during testing;
a heat exchanger in conductive contact with the device; and
a thermal controller for controlling the heat exchanger by using the measured instantaneous power consumption by the device to regulate the temperature of the device during testing.

13. The system of claim 12, wherein the measuring device comprises a monitor for monitoring power usage of the device.

14. The system of claim 13, wherein the monitor monitors complete power usage.

15. The system of claim 12, wherein:
the measuring device comprises:
at least one current measuring device for monitoring the current supplied to the device by one or more power supplies;
at least one voltage measuring device for monitoring the voltage supplied to the device by one or more power supplies; and
a monitoring circuit, coupled to the at least one current measuring device and to the at least one voltage measuring device, for producing a power usage signal from the monitored current and voltage.

16. The system of claim 12, further comprising:
a programmable power supply for supplying power to the device under test, and for supplying a data signal which contains information on the power being used by the device under test; and
a data acquisition device, coupled to the programmable power supply, for acquiring data on the power being used by the device under test by receiving the data signal from the programmable power supply.

17. The system of claim 16, further comprising a monitoring circuit disposed between the programmable power supply and the data acquisition device, wherein the monitoring circuit is adapted to receive the data signal from the programmable power supply and to supply a power usage signal to the data acquisition device, and wherein the device under test is an integrated circuit.

18. The system of claim 16, further comprising a computer, communicatively coupled to the data acquisition device, including a digital storage medium and a display device, wherein the computer is adapted to receive a digital power usage signal from the data acquisition device, to store information from the digital power use signal on the digital storage medium, and to display information from the digital power usage signal on the display device.

19. The system of claim 12, further comprising:
a test head for holding the semiconductor device during testing, wherein the test head allows testing of the device while the device is in conductive contact with the heat exchanger and the setting of the heat exchanger is determined by the thermal controller.

20. The system of claim 19, wherein the thermal controller is adapted to control the heat exchanger such that the heat exchanger maintains the device at or near a first temperature during a first test of the semiconductor device and then maintains the device at or near a second temperature during a second test of the device.

21. In a system in which an electronic device is supplied with a power supply signal and test stimuli signals, and the temperature of the electronic device is actively controlled by a temperature control apparatus, a method for maintaining the temperature of the device near a predetermined set-point temperature, comprising:
determining changes in power dissipated by the electronic device while the device is being tested;
adding or removing heat from the device while the device is being tested in response to the changes in power dissipated by the electronic device to maintain the temperature of the device near the predetermined set-point temperature.

22. The method of claim 21, wherein the electronic device is an integrated circuit device.

23. The method of claim 21, wherein the temperature control apparatus comprises a heat exchanger conductively coupled to the electronic device, the heat exchanger being responsive to the changes in power dissipated by the electronic device.

24. The method of claim 23, wherein the heat exchanger comprises a heat sink having a surface on which a heater element is incorporated, the heat sink removing heat from the device when the temperature of the device exceeds a temperature below the predetermined set-point temperature, and the heater element is controlled based on the changes in power dissipated by the electronic device to selectively introduce heat to maintain the device near the predetermined set-point.

25. The method of claim 21, wherein determining changes in power dissipated by the electronic device includes measuring the current provided to the device while the device is being tested.

26. A system in which an electronic device is supplied with a power supply signal and test stimuli signals, and the temperature of the device is maintained near a predetermined set-point temperature during testing, comprising:
a measuring device which determines changes in power dissipated by the electronic device while the device is being tested;
a temperature control apparatus which adds or removes heat from the device while the device is being tested in response to the changes in power dissipated by the electronic device determined by the measuring device to maintain the temperature of the device near the predetermined set-point temperature.

27. The system of claim 26, wherein the electronic device is an integrated circuit device.

28. The system of claim 26, wherein the measuring device measures the current provided to the device while the device is being tested.

29. The system of claim 26, wherein the temperature control apparatus comprises a heat exchanger conductively coupled to the electronic device, the heat exchanger being responsive to the changes in power dissipated by the electronic device.

30. The system of claim 29, wherein the heat exchanger comprises a heat sink having a surface on which a heater element is incorporated, the heat sink removing heat from the device when the temperature of the device exceeds a temperature below the predetermined set-point temperature, and the heater element is controlled based on the changes in power dissipated by the electronic device to selectively introduce heat to maintain the device near the predetermined set-point.

* * * * *